(12) United States Patent
Kennett et al.

(10) Patent No.: US 9,104,099 B2
(45) Date of Patent: Aug. 11, 2015

(54) CURABLE COATINGS FOR PHOTOIMAGING

(71) Applicant: Rainbow Technology Systems Ltd., Glasgow (GB)

(72) Inventors: Charles Jonathan Kennett, Glasgow (GB); John Cunningham, Glasgow (GB); Robert Gibson, Glasgow (GB)

(73) Assignee: Rainbow Technology Systems, Ltd., Glasgow (GB)

( * ) Notice: Subject to any disclaimer, the term of this patent is extended or adjusted under 35 U.S.C. 154(b) by 0 days.

(21) Appl. No.: 13/837,726

(22) Filed: Mar. 15, 2013

(65) Prior Publication Data
US 2014/0178817 A1 Jun. 26, 2014

(30) Foreign Application Priority Data
Dec. 20, 2012 (GB) .................................. 1223064.5

(51) Int. Cl.
*G03F 7/028* (2006.01)
*G03F 7/085* (2006.01)
*G03F 7/004* (2006.01)
*G03F 7/075* (2006.01)
*G03F 7/038* (2006.01)

(52) U.S. Cl.
CPC .............. *G03F 7/004* (2013.01); *G03F 7/0045* (2013.01); *G03F 7/028* (2013.01); *G03F 7/038* (2013.01); *G03F 7/0751* (2013.01); *G03F 7/0757* (2013.01)

(58) Field of Classification Search
None
See application file for complete search history.

(56) References Cited

U.S. PATENT DOCUMENTS

| 4,064,287 | A | * | 12/1977 | Lipson et al. ................. 430/311 |
| 4,130,708 | A | * | 12/1978 | Friedlander et al. ............. 528/28 |
| 4,157,261 | A | * | 6/1979 | Takeda .......................... 430/253 |
| 4,333,998 | A | * | 6/1982 | Leszyk ........................... 430/12 |
| 4,426,431 | A | * | 1/1984 | Harasta et al. .................. 430/14 |
| 4,485,167 | A | * | 11/1984 | Briney et al. ............... 430/281.1 |
| 4,533,445 | A | * | 8/1985 | Orio ............................... 522/83 |
| 4,668,601 | A | * | 5/1987 | Kistner ......................... 430/162 |
| 4,693,959 | A | * | 9/1987 | Ashcraft ....................... 430/323 |
| 4,888,270 | A | * | 12/1989 | Sullivan ........................ 430/325 |
| 6,337,118 | B1 | * | 1/2002 | Takehana et al. ............ 428/64.1 |
| 2006/0257785 | A1 | * | 11/2006 | Johnson .................... 430/270.1 |

FOREIGN PATENT DOCUMENTS

EP 0 903636 A2 * 3/1999
WO WO-2007/118794 A1 * 10/2007
WO WO-2012/069807 A2 * 5/2012

OTHER PUBLICATIONS

EIT INstrument Markets, Fundmentals of UV Measurement, http://www.eit.com/instruments/fu enough.html downloaded Mar. 8, 2014 copyright 1998 with a writing date of 1993.*
Paul Mills, Ultraviolet (UV) Measurement for Formulators: Part I' Feb. 2009 issue of Pant & Coating Industry Magazine, six pages.*
Monroe et al ,Chemical Reviews , 1993, vol. 93, No. 1, 435-448.*

* cited by examiner

*Primary Examiner* — Cynthia Hamilton
(74) *Attorney, Agent, or Firm* — David Bradin

(57) ABSTRACT

There is herein described curable coatings for use in a photoimaging process. In particular, there is described curable coatings in the form of 100% or substantially 100% solids energy curable coatings for use in a photoimaging process wherein a substrate is covered with a wet curable photopolymer and the photoimaged substrate is used to form images such as electrical circuits or other features used in the Photochemical Machining Industry (PCMI) such as for example lines, squares, spirals, circles, or other geometric and non-geometric shapes.

2 Claims, 3 Drawing Sheets

CURABLE COATINGS FOR PHOTOIMAGING

FIELD OF THE INVENTION

The present invention relates to curable coatings for use in a photoimaging process. More particularly, the present invention relates to curable coatings in the form of 100% or substantially 100% solids energy curable coatings for use in a photoimaging process wherein a substrate is covered with a wet curable photopolymer and the photoimaged substrate is used to form images such as electrical circuits or other features used in the Photochemical Machining Industry (PCMI) such as for example lines, squares, spirals, circles, or other geometric and non-geometric shapes.

BACKGROUND OF THE INVENTION

Although prior techniques exist in the art for producing thin lines and features suitable for forming printed circuit boards (PCBs) or structures in PCMI, many of these techniques suffer from a number of significant disadvantages. For example, many previous techniques suffer from poor resolution. Moreover, techniques which do provide high resolution usually require complex apparatus such as sophisticated laser equipment. A further problem is that previous techniques have required the use of partially cured dry films of photopolymer. The thickness of these dry films has a detrimental effect on the resolution and/or definition of photoimaged surfaces. There are also problems in adhering partially cured dry films to substrates and contamination problems which once again causes problems in the photoimaging process.

It is believed that no 100% solids energy curable coating heretofore available is able to cure with UV energy levels below 20 mJ for use with the photoimaging process herein described to producing images for use within the PCB or the PCMI.

Consequently, it is believed that a PCB prepared using a 100% solids resist over copper imaged using a photo mask with the photoimaging process herein described is a new article of manufacture. Previously, all Liquid Photo Imageable (LPI) materials have contained solvent and required pre drying prior to curing. Therefore the successful use of a 100% solids coating is a novel approach.

The present application is an extension of previous applications by the present applicant such as WO 2010/007405 and WO 2012/069807, which are incorporated herein by reference. The techniques described therein are known as the 'Rainbow Coating Process' which can be used in photoimaging processes.

It is an object of at least one aspect of the present invention to obviate or mitigate at least one or more of the aforementioned problems.

It is a further object of at least one aspect of the present invention to provide a 100% or substantially 100% solids energy curable coating material for use in a photoimaging process.

SUMMARY OF THE INVENTION

According to a first aspect of the present invention there is provided a curable photopolymer comprising:
a curable resin present in an amount of 10% to 90% by weight;
a photoinitiator;
an additive agent; and
an adhesive agent;
wherein the curable photopolymer is capable of being cured with energy of less than about 1,000 mJ and where there is no pre-drying prior to imaging in a photoimaging process.

The present invention therefore relates to a curable photopolymer wherein the curable photopolymer is capable of being cured with no pre-drying prior to imaging with, for example, UV or visible radiation. The curable photopolymer is therefore in a wet form prior to being photoimaged. The coatings are used in what is known as the Rainbow Coating Process which is described in WO 2010/007405 and WO 2012/069807.

The photoinitiator is capable of initiating crosslinking in the wet curable photopolymer. The photoinitiator may be a mixture of photoinitiators.

The additive agent(s) is a wetting agent and is capable of providing humidity resistance, surface wetting leveling and other properties. This enables the wet curable photopolymer to be evenly spread onto a surface where imaging is to occur. The wetting agent may be a mixture of wetting agents.

The adhesive agent is capable of providing adhesion for the bonding of the wet curable photopolymer to various substrates including, but not limited to, metals, glasses and plastic. The adhesive agent may be a mixture of adhesive agents.

The wet curable photopolymer may be cured by being deposited onto a cladding and then cured with a phototool wherein radiation cures the wet curable photopolymer in exposed areas through the phototool.

The wet curable photopolymer may be substantially all solids i.e. zero or very low amounts of solvent may be present. It has been surprisingly found that this provides improved imaging and resolution. However, the present invention also covers having low amounts of solvent present. In the present invention there may therefore be less than about 1% solvent, less than about 3% solvent, less than about 10% solvent or less than about 15% solvent.

In a preferred embodiment the wet curable photopolymer is preferably 100% solids and therefore solvent free with no volatile organic content. The present inventors have found that by having solvent present this allows unwanted cracking and fissures to form in the photoimaged area. The cracks and fissures not only have a detrimental effect on the lower level of possible resolution but can also lead to device failure such as in PCBs and PCMI.

The curable photopolymer is capable of being cured with energy of about 0-20 mJ, about 0-50 mJ, about 50-500 mJ or about 100-1,000 mJ.

Alternatively, the wet curable photopolymer may cure with a very low energy requirement such as in the range of about 0.5-20 mJ for, for example, about a 5 micron coating but more preferably in the range from about 1.5 mJ-2.0 mJ for, for example, about a 5 micron coating. The present invention of the Rainbow Coating Process allows for low energy curing due to the lamination process which eliminates any oxygen being trapped underneath the photopolymer and thereby preventing any oxygen inhibition.

The wet liquid photoresist polymer may be deposited in a substantially even and continuous manner using any suitable technique. For example, the liquid photoresist layer may be deposited using a spray, a screen printing system, a brush, a roller and/or a dip coating system.

The coating of wet curable photopolymer may be cured with electromagnetic radiation of wavelength from about 200 nm to about 500 nm but is preferably cured with electromagnetic radiation of wavelength from about 365 nm to about 415 nm or even with electromagnetic radiation between about 395 nm to about 405 nm.

The coating of wet curable photopolymer may have good adhesion to a range of substrates such as copper, polyester, FR4, glass, polyimide etc.

Once the coating of wet curable photopolymer has been cured into a printed image then the printed image is developable in water based solutions of potassium or sodium carbonates in the range from about 0.1% concentration w/v (i.e. weight on volume) to about 2% concentration w/v but preferably in the range from about 0.5% to 0.9% concentration w/v.

Alternatively, the coating of wet curable photopolymer may be developable in a mix of water and solvent solutions such as, for example, a mix of about 80% water with about 20% n-2-propanol or even a mix of about 20% water with about 80% n-2 propanol.

The wet curable photopolymer material may also be suitably modified to be thixotropic, dilatant or Newtonian dependent on the end use of the final coating. Due to the often uneven or open nature of the substrate it may be preferred that a structured coating is formulated as opposed to a free flowing Newtonian coating which may of its nature unintentionally flow down apertures on the substrate. A structured coating such as a thixotrope would freely flow over any opening under the pressure of the coating process but immediately revert to a more structured coating on the removal of the application pressure thus preventing the unintentional flow into the aperture which will then be immediately be cured in position by the incident electromagnetic radiation curing the coating and prevent leakage through the aperture.

The features of the present coating system are achieved by providing a coating material in the form of the wet curable photopolymer preferably composed of a unique combination of UV curable resins blended together in various combinations to provide etch resist, solder mask and dielectric coatings. The formulation of the present coating material permits its effective use at a multitude of viscosities. The versatility in potential viscosities which may be used in accordance with the present invention permits the present coating system to be used for coating vertical and/or horizontal surfaces in a wide range of coating thicknesses to provide an evenly distributed look to the substrate being coated.

Photopolymerization of the wet curable photopolymer formulation is ensured by the addition of a variety of photoinitiators to the coating material in a manner which is discussed below in greater detail. Rapid curing is achieved through the application of electromagnetic radiation curing. In accordance with a preferred embodiment, ultraviolet ("UV") and/or visible light photopolymerization is the preferred mode, although it is contemplated that infrared wave energy may also be utilized in conjunction with the photo-initiation for a variety of surface curing properties or as the total source of electromagnetic radiation.

The curing technique used in accordance with a preferred embodiment of the present invention may rely upon a combination of UV and visible light (as defined by wavelengths from about 220 nm to about 380 nm for UV and about 380 nm to about 480 nm for visible light). The combination of UV and visible light curing permits the use of cationic or free radical curing systems as known to those skilled in the art and described in current commercial chemical literature. This allows for extremely rapid curing, normally in seconds, of broad area coating with minimal odor, heat, time and energy requirements. The present coating system's ability to produce a desirable coating with minimal odor, heat, time and energy requirements makes it highly suitable for use in both the PCB and PCMI.

In accordance with preferred embodiments of the present coating system, the coating material may be composed of any one of or combination of the following: UV or visible light photoinitiator(s); UV curable resin(s); acrylate and/or methacrylate monomer(s); wetting agents; UV stabilizers; rheology modifier(s); adhesive promoter(s) and/or self-leveling agent(s).

The following points outline the preferred materials used in accordance with the present invention. This list merely presents a suggested raw material list from which the various ingredients of the present coating material may be obtained, and those of ordinary skill in the art will readily appreciate that the components making up the present coating material may be purchased from a variety of vendors without departing from the spirit of the present invention.

One or more photoinitiators may be included in the composition to initiate the crosslinking of the material. The photoinitiators may be either free radical or cationic in nature, or a combination of both. Examples of photoinitiators include, but are not limited to: 1-hydroxy-cyclohexyl-phenylketone; 2-hydroxy-2-methyl-1-phenyl-1-propanone; 2-hydroxy-1-[4-(2-hydroxyethoxy)phenyl]-2-methyl-1-propanone; alpha-dimethoxy-alpha-phenylacetophenone; 2-benzyl-2-(dimethylamino)-1-[4(4-morpholinyl)-1-butanone); 2-methyl-1-[4-(methylthio)phenyl]-2-(4-morpholinyl)-1-propanone; diphenyl(2,4,6-trimethylbenzoyl)-phosphine oxide; phosphine oxide; phenyl bis(2,4,6-trimethyl benzoyl); phosphine oxide iodonium and (4-methylphenyl)[4-(2-methylpropyl)phenyl]-hexafluorophosphate.

In addition, acylphosphorus compounds can be used as photoinitiators such as: 2,4,6-triorganobenzoyldiarylphosphine oxides; 2,4,6-trimethylbenzoyldiphenylphosphine oxide; 2,4,6-triethylbenzoyldinaphthylphosphine oxide; 2,4,6-triorganobenzoyl diorganophosphonates, such as, 2,4,6-trimethylbenzoyl diethylphosphonate and triorganobenzoyldiarylphosphine sulfides, such as 2,4,6-trimethylbenzoyldiphenylphosphine sulfide commercially available under the Irgacure or Darocur trademarks from Ciba Specialty Chemicals; mixed arylsulfonium hexafluoroantimonate salts; mixed arylsulfonium hexafluorophosphate salts, commercially available under the Cyracure trademark from Dow Chemical; benzophenone; 4-phenyl benzophenone; 4-methyl benzophenone; 2-isopropyl thioxanthone; 2-chlorothioxanthone; 2,4-diethylthioxanthone; commercially available under the Omnirad trademark from IGM resins, and mixtures thereof.

Certain photoinitiators which are more effective in combination with amines include, but are not limited to: 2-dimethylamino-ethylbenzoate; ethyl-4-(dimethylamino)benzoate; 2-ethyl-4-(dimethylamino)benzoate; isoamyl 4-(N,N-dimethylamino)benzoate commercially available from under the Omnirad trademark from IGM resins, and mixtures thereof.

The one or more photoinitiators may comprise in the range of about 0.1% to about 15% weight on weight of the composition and preferably in the range of about 0.1% to about 1.5% weight on weight or about 0.1% to about 3% weight on weight of the composition for cationic coatings and preferably in the range of about 8.0% to about 10.0% weight on weight of the composition for free radical coatings.

The photoinitiators used in accordance with a preferred embodiment of the present invention may be selected for absorbing energy in the wavelength band from about 385 nm to about 415 nm. The photoinitiators may be extremely reactive for fast cures in seconds and imparting surface cure to the formulation to give hard, durable chemically resistant surfaces and giving depth of cure down to the substrate surface regardless of coating thickness.

With this in mind, the present blend of photoinitiators can be used in combination in both thick and thin UV curable protective coating systems that allow the coating to be placed in acidic or alkaline environments suitable for etching the substrates to which the coating has been applied.

In accordance with a preferred embodiment of the present invention using the Rainbow Coating Process as described in WO 2010/007405 and WO 2012/069807, the following photoinitiators are combined to provide a blended photoinitiator offering optimum characteristics:

Formula

| Photoinitiator Blend | Amount (w/v %) |
| --- | --- |
| Velsicure Benzophenone | 16.00 |
| Irgacure 184 | 28.00 |
| Genocure EPD | 8.00 |
| Genocure ITX | 8.00 |
| Speedcure DETX | 8.00 |
| Genocure TPO | 4.00 |
| Genocure PMPO | 8.00 |
| Irgacure 369 | 9.50 |
| Genocure BDK | 10.50 |

[TPO (BASF) 2,4,6 Trimethyl benzoyl diphenyl phosphine oxide maybe replaced with Irgacure 819, manufactured by Ciba, Inc.].

This proprietary blend provides a photoinitiator with broad intense absorption over a wide spectrum of wave energy and also has rapid reactivity to low levels of intensity as found in UV LED lamps.

It is further contemplated that MBF (Methylbenzoyl formate), an aromatic ketone, may be used with the proprietary blend as disclosed above to enhance reactivity and provide for durable hard surface cures with monomers and resins which exhibit oxygen inhibition.

It is also contemplated that Irgacure (Trade Mark) 184, 1-Hydroxycyclohexyl phenyl ketone, may be used in combination Darocur (Trade Mark) TPO to provide similar performance.

The various components of the present coating material offer added functionality resulting in the highly useful coating system of the present invention. For example, the blending of several photoinitiators provides a coating system with full depth cure in thick sections. The blending of several photoinitiators also provides a hard surface while preventing surface distortion.

In addition, the total coating system may be formulated to prevent oxygen from inhibiting the ultimate curing of the coating material. The wetting agents provide humidity resistance, surface wetting and leveling properties to the coating system in conjunction with the leveling agents used and the adhesive agents provide adhesion for the bonding of the present coating system to various substrates including, but not limited to, metals, glass and plastic.

In accordance with a preferred embodiment of the present invention, a novel blend of UV curable resins may be employed in the coating material. The resin blend comprises approximately about 5% to about 60% by weight of the coating material, wherein each resin making up the blend preferably constitutes approximately 10% to 30% of the resulting UV curable resin blend.

This novel combination of UV curable resins can be used in both thick and thin UV curable etch resist coating systems. The blend provides for a coating material that rapidly cures to a hard, acid and alkaline resistant coating.

The resins combined to form the present blend may be selected from any one of or combination of the following: aliphatic linear polyether urethane acrylate; aliphatic polyester urethane acrylate; and polyester acrylated monomer blend with fast cure characteristics. More specifically, the aliphatic linear polyether urethane acrylate having high functionality provides for a combination of good hydrolytic stability, good chemical resistance, good abrasion resistance, good gloss and low viscosity. The aliphatic polyester urethane acrylate provides for good solvent resistance and flexibility. The polyester acrylate monomer blend provides for toughness, excellent solvent resistance, low viscosity and cure modifier.

Representative examples of the UV curable monomer used in the present invention, which acts to control the viscosity of the oligomer as a reactive diluent, include any one of or combination of the following: pentaerythritol tri/tetra-acrylate (PETA); trimethylolpropane triacrylate (TMPTA); trimethylolpropane ethoxy triacrylate (TMPEOTA); hexamethylene diacrylate (HDDA); Dipropyleneglycol diacrylate (DPGDA); tripropyleneglycol diacrylate (TPGDA); Isobornyl acrylate (IBOA) and Hexylethyl acrylate (HEA). The equivalent methacrylates can also be utilized in the formulation such as: HEMA; TMPTMA; IBOMA and Ethoxylated TMPTMA. Methacrylates act to improve adhesion and also to reduce cure speed as they are slower curing than their equivalent acrylate.

Preferably, the monofunctional branched or carbocyclic acrylate is selected from the class comprising of: isobornyl acrylate; cyclohexyl acrylate; tert-butyl acrylate; 2-ethylhexyl acrylate; dicyclopentenyl acrylate; tetrahydrofurfuryl acrylate; cyclic trimethylopropane formal acrylate or a mixture thereof.

The monomers are outlined below with their specific characteristics:

| | |
| --- | --- |
| HDDA | fast curing, low volatility, good chemical resistance, good adhesion, good hardness, good heat resistance, good abrasion resistance; |
| CTFA | Adhesion, increased flexibility, low shrinkage; |
| IBOA | High Tg properties, excellent reactivity, good flexibility, good impact resistance, good water resistance for thin film curing; |
| IBOMA | Similar properties to IBOA but with a slower cure for thick curing sections to prevent surface distortion (wrinkling); |
| TMPTA | Fast cure response, low volatility, good chemical resistance, good hardness, good heat resistance, good abrasion resistance; |
| TMPEOTMA | Similar properties to TMPTA but with a slower cure for thick section cure; |
| TMPEOTA | Low shrinkage, very low viscosity, good chemical resistance, good adhesion, good hardness, good heat resistance, good abrasion resistance, good impact. Used for thick section curing because of low shrinkage and slower curing; and |
| HEMA | Cross linkable, hydrophobic, improved adhesion, critical for glass bonding. |

The wet curable photopolymer may also comprise acrylate monomers which are monofunctional and multifunctional acrylates e.g. methacrylate monomers which are monofunctional and multifunctional methacrylates.

The wet curable photopolymer may also comprise any one of or combination of the following to improve adhesion to metal or glass surfaces: Acrylic acid; β-CEA; Epoxy Silane and Trifunctional acid esters. These components may be added at a level up to about 5% w/v.

The following additional products may be used in the formulation of the wet curable photopolymer to impart specific wetting agent properties to the final formulation:

a. a blend of the following wetting agents may be utilized but not limited to acrylate copolymers, such as Byk-359 and Byk-361N commercially available from Byk Chemie;

b. polyether modified polydimethylsiloxane, commercially available as Byk UV3510;
c. polyether modified dimethylsiloxane, commercially available as Byk UV3530;
d. polyether modified polydimethylsiloxane, commercially available as Tego rad 2200;
e. polyether modified dimethylsiloxane, commercially available as Tego rad 1800
f. polymeric dispersant, commercially available as Disperbyk 162 available from BYK Chemie;
g. polymeric dispersant commercially available as Solsperse 24000;
h. polyether amido acid polyamine derivative, commercially available as Solsperse 5000 and Solsperse 22000 form Noveon;

and mixtures thereof. These components may be present in the range of about 0.1% to about 5% w/w of the composition and preferably in the range of about 0.1% to about 1.0% w/w of the composition.

Various other additives may be included as desired such as any one of or combination of the following:
a. surface active agents;
b. surfactants;
c. wetting agents;
d. antioxidants;
e. thixotropes;
f. dilatants;
g. reinforcement materials;
h. silane functional perfluoroether;
i. phosphate functional perfluoroether;
j. silanes;
k. titanates;
l. wax;
m. air release agents;
n. flow additives;
o. adhesion promoters;
p. rheology modifiers;
q. surfactants; and
r. spacer beads The ingredients are specifically chosen to obtain the desired balance of properties for the use of the resins utilized in the particular composition.

In accordance with a preferred embodiment of the present invention, it has been found that ideal results are produced where the components of the present coating material are combined in the following manner:
resins approximately 10% to 60% by weight e.g. acrylate and/or methacrylate monomers; approximately 5% to 20% by weight;
photoinitiators approximately 0.1% to 15% by weight;
leveling agents approximately 0.3% to 1% by weight;
stabilizers approximately 0.1% to 0.5% by weight;
adhesion promoters approximately 5% to 10% by weight;
rheology modifiers approximately 0.1% to 5.0% by weight; and
wetting agents approximately 0.01% to 0.5% by weight.

The various components of the present wet curable photopolymer coating material in accordance with the present invention include no VOC or HAPS related solvents, are environmentally friendly, and are not regulated in any form for use or transportation. In addition, the various components do not require special protective equipment other than normally used with chemicals.

In addition, the wet curable photopolymer coating material may be readily formulated to provide a large range of viscosities to be used for thin coats and thicker coating for plating resist and solder masks on a multitude of surfaces.

The wet curable photopolymer coating material may also be pigmented or dyed to effect matching colours while not inhibiting the photopolymerization of the coating. The cured coating material offers good moisture resistance and provides a, durable surface when placed in acidic or alkaline solutions as used in the PCB or PCMI.

The wet curable photopolymer in the present invention may be described as an energy curable etch resist composition. In particular embodiments the wet curable photopolymer may comprise:
a. about 1 w/w % to 60 w/w % of an acidic acrylate monomer;
b. about 1 w/w % to 50 w/w % of a urethane acrylate monomer;
c. about 25 w/w % to 90 w/w % of di-, tri- and hexa-acrylate monomer consisting essentially of a mixture of about 20 w/w % to 90 w/w % of hexanediol diacrylate; and about 10 w/w % to 80 w/w % of a mono-functional branched or carbocyclic acrylate; and
d. about 1 w/w % to 15 w/w % of a photoinitiator or blend of photoinitiators.

BRIEF DESCRIPTION OF THE DRAWINGS

Embodiments of the present invention will now be described, by way of example only, with reference to the accompanying drawings in which.

BRIEF DESCRIPTION

Figure 1:
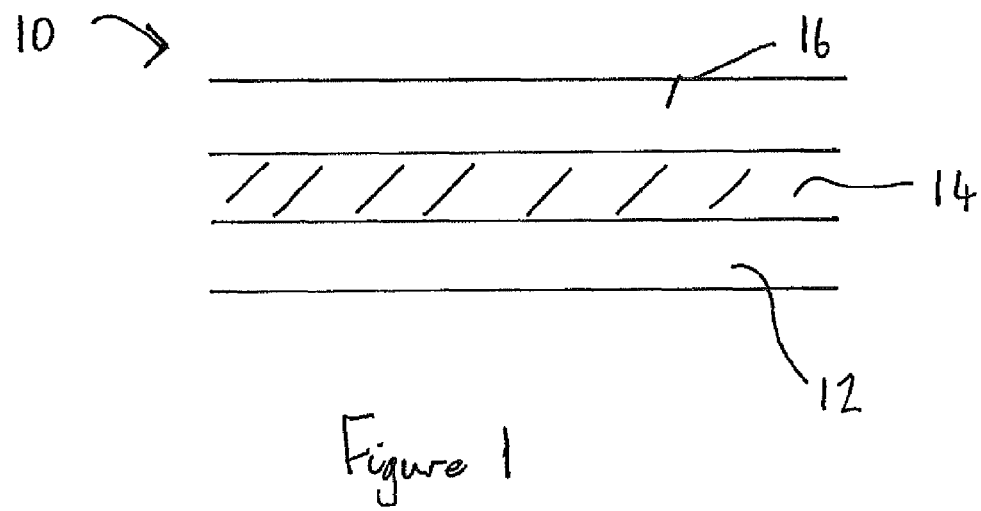
FIG. 1 is a sectional side view of a three-layer structure according to an embodiment of the present invention.

FIG. 1 is a sectional side view of a three-layer structure 10 of the present invention which is capable of being imaged where there is a bottom layer 12 which is a substrate, a middle layer 14 which is a wet curable photopolymer and a top layer 16 which is clear plastic or a phototool or preferably a phototool or plastic which has been coated with a protective layer which acts as a release coat and which also offers both chemical and moisture resistance. The wet curable photopolymer is as herein described and is therefore imaged using the Rainbow process as described in WO 2010/007405 and WO 2012/069807.

Figure 2:
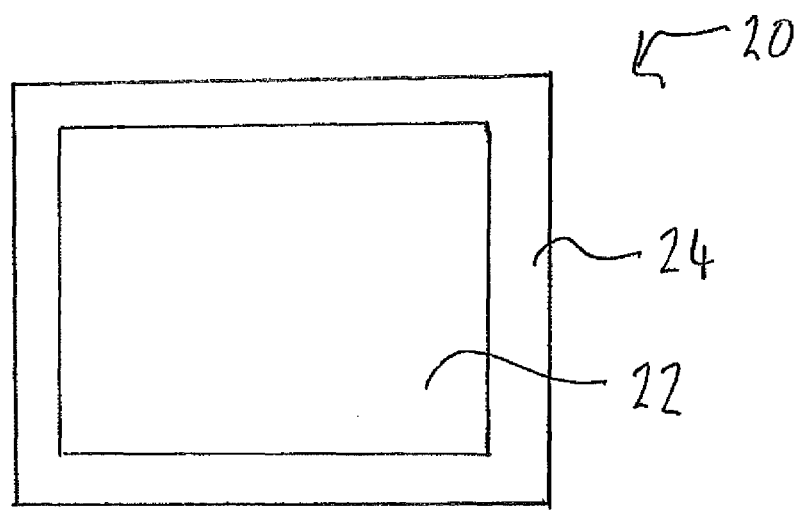
FIG. 2 is a view of a sealed pouch according to an embodiment of the present invention.

As shown in FIG. 2 the present invention allows a sealed pouch 20 to be formed. The sealed pouch 20 comprises a sealed border 24 formed around a pouch of liquid UV photopolymer 22.

Figure 3:
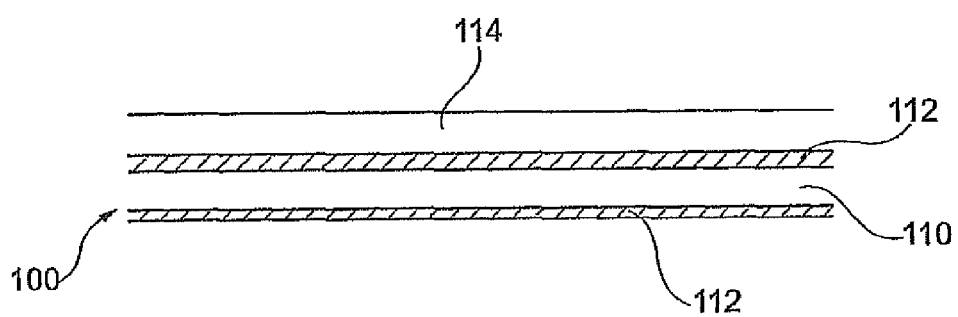
FIG. 3 is a sectional side view of a substrate with a wet photopolymer layer deposited thereon according to an embodiment of the present invention.

FIG. 3 is a sectional side view of a laminated structure, generally designated 100 according to an embodiment of the present invention. The laminated structure 100 comprises a substrate 110 such as a dielectric layer and a cladding 112 on both sides. The cladding may be metal. On top of the laminated structure 100 there is a layer of a liquid photopolymer 114. The photopolymer layer 114 is therefore wet. The liquid photopolymer layer 114 has a thickness of about 5 μm. Although not shown in FIG. 3, the photopolymer layer 114 may be applied to both sides of the laminated structure 100.

The photopolymer layer 114 is first of all deposited in a substantially even and continuous or at least substantially continuous manner using any suitable technique onto the laminated structure 100. For example, the photopolymer layer 114 is applied using a spray, a brush, a roller and/or a dip coating system. In the present invention there is no drying step (i.e. a pre-drying step) before the film of wet photopolymer is irradiated with, for example, UV radiation.

Once the photopolymer layer 114 has been applied to the laminated structure 100, a phototool 116 is applied to the photopolymer layer 114. The phototool 116 is a negative (or positive) image of a desired electrical circuitry and allows light to pass through some parts of the phototool 116 but not others. The phototool is made from flexible plastic material or possibly glass or even potentially plexiglass.

Figure 4:
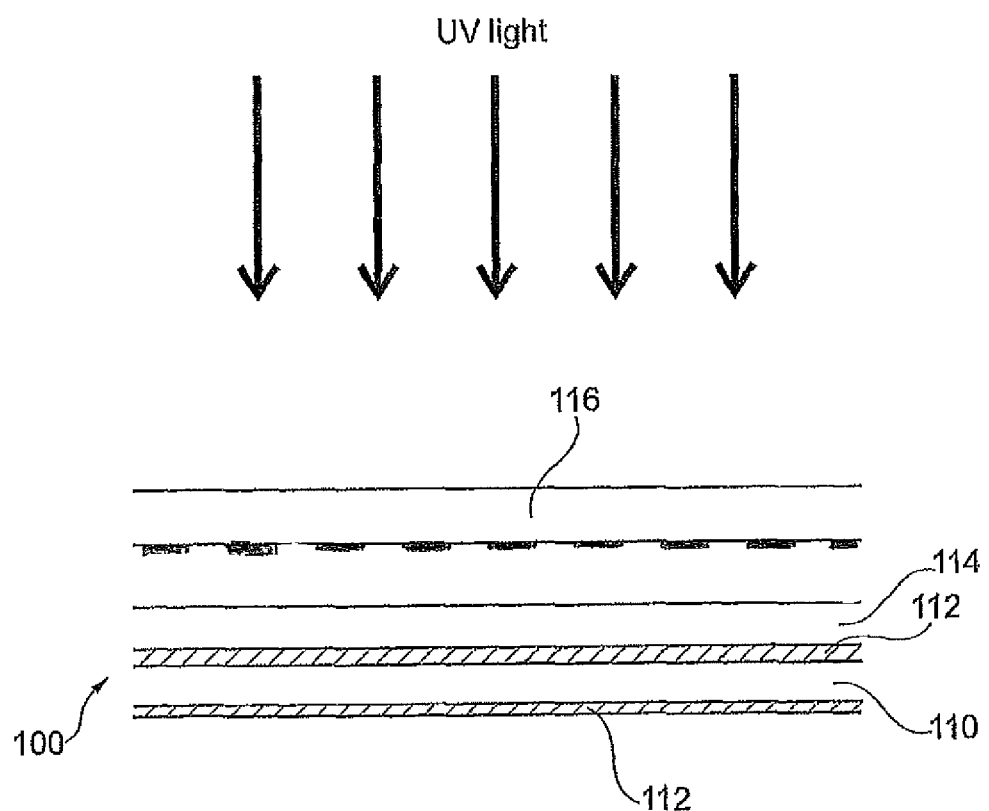
FIG. 4 is a sectional side view of the substrate with the wet photopolymer layer shown in FIG. 3 wherein a phototool is being used in a photoimaging process according to an embodiment of the present invention.

FIG. 4 represents the phototool 116 being applied to the laminated structure 100. After the phototool 116 has been applied to the laminated structure 100 comprising the liquid photopolymer 114, a compression system is used to spread out and/or squeeze the photopolymer 114 so that an even spread of the photopolymer 114 is achieved with a substantially even thickness of about 5 μm between the phototool 116 and the substrate cladding 112. The compression system also ensures that no air and hence oxygen is trapped underneath the photopolymer 114. For example, a roller based system applies a compressive force and is used to spread the photopolymer 114. A rubber cylindrical roller may therefore be used to spread the photopolymer 114. This may occur on both sides of the laminated structure 100. This overcomes the need to have complex light systems including parabolic mirrors as all air and oxygen is eliminated.

As shown in FIG. 4, UV radiation is used to polymerise and/or harden and/or set the exposed liquid photopolymer 114. The UV radiation has a wavelength of about 200-400 nm and has an intensity matched to cure the exposed liquid photopolymer 114. Any suitable UV light source may be used but UV LEDs are particularly suitable as they produce very small amounts of heat, have a long lamp life, start up immediately, have substantially no fall-off in power output, are low maintenance and can produce high levels of light intensity. LEDs can therefore be used to print fine lines squares, spirals, circles, or other geometric and non-geometric shapes in an inexpensive photoimaging process. Alternatively, a laser light source or DMD digital imaging unit is used. A significant advantage to note is that no partially cured dry films of photopolymer (e.g. Riston, Trade Mark, DuPont) are required which therefore significantly reduces any line growth during the imaging process giving significantly improved resolution. The resolution of the method of the present invention is therefore enhanced by overcoming the need to have no partially cured dry films or pre-dried solvent based wet resists.

Below are a number of particular formulations for the wet curable photopolymer according to the present invention.

Formula 1

| Transparent etch resist (yellows) | Amount (w/v %) |
|---|---|
| Ebecryl 2047 | 13.36 |
| Ebecryl IBOA | 49.30 |
| CL1039 | 16.60 |
| Beta-CEA | 15.30 |
| Photoinitiator blend 2 | 5.30 |
| Tegoglide 2200 | 0.14 |
| Total: | 100.00 |

Formula 2

| Non Yellowing transparent etch resist | Amount (w/v %) |
|---|---|
| IBOA | 10.40 |
| HDDA | 21.70 |
| CL1039 | 11.30 |
| Beta-CEA | 21.70 |
| Ebecryl 40 | 26.10 |
| Photoinitiator blend 2 | 8.80 |
| Total: | 100.00 |

Formula 3

| Blue etch resist | Amount (w/v %) |
|---|---|
| Polyester acrylate Ebecryl 2047 | 12.70 |
| Monofunctional acrylate (IBOA) | 46.96 |
| Monofunctional urethane acrylate (Ebecryl CL-1039) | 15.80 |
| Adhesion promoter (Beta-CEA) | 14.60 |
| Levelling agent (Tegorad 2200) | 0.14 |
| Blue coloured base | 4.80 |
| Mix then add: | |
| Photoinitiator blend 1 | 5.00 |
| Total: | 100.00 |

Formula 4

| Photoinitiator Blend 1 | Amount (w/v %) |
|---|---|
| Genocure EPD | 5.00 |
| Velsicure Benzophenone | 5.00 |
| Genocure CPK | 30.00 |
| Genocure PMPO | 10.00 |
| Genocure DMHA | 10.00 |
| Irgacure 819 | 10.00 |
| Genocure TPO | 30.00 |
| Total: | 100.00 |

Formula 5

| Blue coloured base | Amount (w/v %) |
|---|---|
| Transparent ink vehicle | 30.00 |
| Solsperse 24000 | 7.10 |
| Solsperse 5000 | 2.00 |
| Florstab UV1 | 2.00 |
| Mix thoroughly to ensure that the Solsperse has melted (48-52° C.) then add: | |
| Blue NGA | 23.00 |
| Mix thoroughly then grind to between 3 & 5 microns. Add & mix: | |
| Transparent ink vehicle | 15.90 |
| DPGDA (Actilane 422) | 20.00 |
| Total: | 100.00 |

Formula 6

| Acrylic resin blend | Amount (w/v %) |
|---|---|
| Genomer 1343 | 15.00 |
| Actilane 422 | 15.00 |
| Acrylic Resin Mix | 20.00 |
| Urethane acrylate (Actilane 276) | 30.00 |
| Genomer 1658 | 20.00 |
| Total: | 100.00 |
| Total: | 100.00 |

Formula 8

| Acrylic resin mix | Amount (w/v %) |
|---|---|
| Acrylic resin (PARALOID DM55) | 50.00 |
| Ethoxylated TMPTA (Genomer 1343) | 50.00 |
| Total: | 100.00 |

The formulae 1, 2 and 3 were printed using the photoimaging process of the present invention and printed on copper laminate with ½ oz copper, a polyester substrate and exposed to a curing dose of UV radiation which was provided by a 395 nm UV LED array. Following UV cure the etch resist was tested for adhesion using 3M Scotch 610 tape. During trials a test pattern of circuits was printed. Sections removed from the test panels were then subjected to etch and strip tests using industry standard copper chloride or ammoniacal etch and 5% sodium hydroxide solution, Results are noted in the table below.

The results show that the formulae do cure with the expected low energy and withstand the industry etch solutions.

| Results | Formula 1 | Formula 2 | Formula 3 |
|---|---|---|---|
| Adhesion to copper | Y | Y | Y |
| Adhesion to glass | N | Y | N |
| Adhesion to plastic (polyester) | Y | Y | Y |
| Withstands copper chloride etch at 48 C. | Y | Y | Y |
| Withstands ammoniacal etch at 43° C. | Y | N | Y |
| Strips in 5% NaOH at 60° C. | Y | Y | Y |
| Develops with 20% N-2-propanol 80% water mix | Y | Y | N |
| Develops with 80% N-2-propanol 20% water mix | Y | Y | Y |
| Cures with <20 mJ electromagnetic radiation 395 nm using the Rainbow Process | Y | Y | Y |
| Cures with <2 mJ electromagnetic radiation 395 nm using the Rainbow Process | Y | N | N |
| Cures with <20 mJ electromagnetic radiation 395 nm in air | N | N | N |
| Cures with <20 mJ electromagnetic radiation 200 nm-500 nm in air | N | N | N |
| Cures with 300 W/in medium pressure mercury UV lamp in air | Y | Y | Y |

Whilst specific embodiments of the present invention have been described above, it will be appreciated that departures from the described embodiments may still fall within the scope of the present invention. For example, any suitable type of suitable wet curable photopolymer may be used in the coating process as herein described (i.e. the Rainbow Coating Process) which is capable of being cured and photoimaged with energy of less than 20 mJ for a 5 micron coating.

The invention claimed is:

1. A curable photopolymer composition comprises the following:
   a curable resin present in an amount of 10% to 60% by weight of the composition;
   one or more photoinitiators in an amount of 2% to 12% by weight of the composition;
   leveling agents in an amount of 0.3% to 1% by weight of the composition;
   stabilizers in an amount of 0.1% to 0.5% by weight of the composition;
   adhesion promoters in an amount of 5% to 10% by weight of the composition;
   rheology modifiers in an amount of 0.1% to 5.0% by weight of the composition;
   and
   wetting agents in an amount of 0.01% to 0.5% by weight of the composition.

2. The curable photopolymer composition of claim 1, wherein the curable resin comprises acrylate and/or methacrylate monomers.

* * * * *